(12) United States Patent
Ohno et al.

(10) Patent No.: US 9,153,306 B2
(45) Date of Patent: Oct. 6, 2015

(54) TUNNEL MAGNETORESISTIVE EFFECT ELEMENT AND RANDOM ACCESS MEMORY USING SAME

(75) Inventors: Hideo Ohno, Miyagi (JP); Shoji Ikeda, Miyagi (JP); Hiroyuki Yamamoto, Tokyo (JP); Yosuke Kurosaki, Tokyo (JP); Katsuya Miura, Tokyo (JP)

(73) Assignee: TOHOKU UNIVERSITY, Sendai-Shi (JP)

( * ) Notice: Subject to any disclaimer, the term of this patent is extended or adjusted under 35 U.S.C. 154(b) by 0 days.

(21) Appl. No.: 14/356,739

(22) PCT Filed: Nov. 8, 2011

(86) PCT No.: PCT/JP2011/075698
§ 371 (c)(1),
(2), (4) Date: Jul. 15, 2014

(87) PCT Pub. No.: WO2013/069091
PCT Pub. Date: May 16, 2013

(65) Prior Publication Data
US 2014/0340961 A1 Nov. 20, 2014

(51) Int. Cl.
*G11C 11/16* (2006.01)
*H01L 43/10* (2006.01)
*H01L 43/08* (2006.01)
*H01L 27/22* (2006.01)

(52) U.S. Cl.
CPC ............ *G11C 11/161* (2013.01); *H01L 27/228* (2013.01); *H01L 43/08* (2013.01); *H01L 43/10* (2013.01)

(58) Field of Classification Search
CPC ...... G11C 11/16; G11C 11/15; G11C 7/1075; H01L 43/08; H01L 27/224; H01L 27/228; H01L 27/22; H01L 43/10; H01L 27/226
See application file for complete search history.

(56) References Cited

U.S. PATENT DOCUMENTS

| 2005/0117392 A1 | 6/2005 | Hayakawa et al. |
| 2007/0086121 A1 | 4/2007 | Nagase et al. |
| 2009/0091863 A1 | 4/2009 | Hosotani et al. |

(Continued)

FOREIGN PATENT DOCUMENTS

| JP | 2005-116923 A | 4/2005 |
| JP | 2007-142364 A | 6/2007 |
| JP | 2009-094104 A | 4/2009 |

OTHER PUBLICATIONS

Ikeda, S., et al., "A perpendicular-anisotropy CoFeB—MgO magnetic tunnel junction," *Nature Materials*, vol. 9, Sep. 2010, pp. 721-724, published online Jul. 11, 2010.

(Continued)

*Primary Examiner* — Hien Nguyen
(74) *Attorney, Agent, or Firm* — Brinks Gilson & Lione

(57) ABSTRACT

Provided is a tunnel magnetoresistive effect element such that a high TMR ratio and a low write current can be realized, and the thermal stability factor ($E/k_BT$) of a recording layer and a pinned layer is increased while an increase in resistance of the element as a whole is suppressed, thus enabling a stable operation. On at least one of a recording layer 21 and a pinned layer 22 each comprising CoFeB, electrically conductive oxide layers 31 and 32 are disposed on a side opposite to a tunnel barrier layer 10.

15 Claims, 5 Drawing Sheets

(56) References Cited

U.S. PATENT DOCUMENTS

2010/0188893 A1* 7/2010 Zhou ............................ 365/171
2011/0170339 A1* 7/2011 Wunderlich et al. .......... 365/158

OTHER PUBLICATIONS

International Search Report in corresponding International Application No. PCT/JP2011/075698, dated Dec. 20, 2011, 3 pages.

* cited by examiner

TUNNEL MAGNETORESISTIVE EFFECT ELEMENT AND RANDOM ACCESS MEMORY USING SAME

TECHNICAL FIELD

The present invention relates to a tunnel magnetoresistive effect element with a perpendicular easy axis, and a random access memory using the same.

BACKGROUND ART

In recent years, a magnetic random access memory (MRAM) has been developed as a memory using magnetic material. The MRAM uses, as an element device, a magnetic tunneling junction (MTJ) that utilizes a tunneling magnetoresistive (TMR) effect. The MTJ element has a structure of a non-magnet layer (insulating layer) sandwiched by two ferromagnet layers (a recording layer and a pinned layer), in which the magnetization direction of one of the ferromagnet layers (recording layer) can be reversed by an external magnetic field. Thus, in the MTJ element, information is recorded by controlling the magnetization direction of a magnet layer. Because the magnetization direction of the magnet layer does not change even when power supply is turned off, a non-volatile operation in which the recorded information is retained can be realized. The magnetization direction of the MTJ element can be changed (i.e., information can be rewritten) by, in addition to the system of applying a magnetic field from the outside, a spin transfer torque magnetization reversal (spin injection magnetization reversal) system that has recently been identified, by which the magnetization is reversed by causing a DC current to flow through the MTJ element directly. For example, Patent Document 1 discloses a MTJ element using the MTJ element with an in-plane magnetization easy axis (in-plane MTJ element) as the recording layer, and utilizing spin injection magnetization reversal, and a spin-transfer torque magnetic random access memory (SPRAM) which is a memory integrating the MTJ elements. The SPRAM may be referred to as a STT-MRAM.

The resistance of the MTJ element is varied by a difference in magnetization direction between the recording layer and the pinned layer. The ratio of change in resistance is referred to as a tunnel magnetoresistive (TMR) ratio. In memory applications, a high TMR ratio is desirable in order to read the information of "0" and "1" without error. In order to obtain a high TMR ratio, crystal orientation control of a tunnel barrier layer and high polarizability magnetic layers on both sides of the tunnel barrier layer is important. From the past studies on the in-plane MTJ, it is known that a high TMR ratio can be obtained when MgO (001) with a NaCl structure is used as the tunnel barrier layer, with CoFeB layer or CoFe layer with a bcc (001) crystal structure disposed on both sides of the tunnel barrier layer. When CoFeB is formed at room temperature, CoFeB grows amorphously. When MgO is formed thereon, a MgO (001) crystal grows. After CoFeB is formed further thereon, when an anneal process is performed, a CoFeB layer is crystal-oriented in bcc (001) with the MgO (001) crystal as a nucleus. In the case of an in-plane magnetization TMR element, MgO (001) and bcc (001) orientation of CoFeB are realized by using such a mechanism.

Further, in a SPRAM, current is caused to flow by a transistor connected to the MTJ element so as to reverse the magnetization of the recording layer of the MTJ element. When the gate length of the transistor is decreased as a result of an increase in memory integration, the amount of current that the transistor can cause to flow is also decreased. Thus, a lower write current $I_{co}$ is required for the MTJ element used in the SRPAM. Further, when element miniaturization is attempted, thermal stability of magnetic information in the MTJ element presents an issue. When the thermal energy ($k_B T$, where $k_B$ is the Boltzmann constant, and T is the absolute temperature) due to environment temperature is high with respect to the magnetic energy barrier (E) required for reversing the magnetization direction of the recording layer of the MTJ element, magnetization reversal occurs without application of an external magnetic field or current. Because the magnetic energy barrier of the MTJ element is decreased with decreasing size, the thermal stability factor $E/k_B T$ is reduced as a result of element miniaturization. Accordingly, the MTJ element applied in a SPRAM requires high TMR ratio and $E/k_B T$, and a low write current $I_{co}$.

As a promising structure for improving the high $E/k_B T$ and low $I_{co}$ characteristics, development of an MTJ element using perpendicular magnetization material (perpendicular MTJ element) is underway (see Patent Document 2, for example). Also, a new perpendicular MTJ element structure that uses CoFeB as a perpendicular magnetization material has been identified (Non-Patent Document 1). Normally, CoFeB is a material that exhibits an in-plane magnetization easy axis. However, in a structure in which an oxide layer, such as MgO, is disposed on an interface of CoFeB, perpendicular magnetic anisotropy appears as the CoFeB film thickness is decreased.

Patent Document 1: JP 2005-116923 A
Patent Document 2: JP 2007-142364 A
Non-Patent Document 1: S. Ikeda et al., Nature Materials, 9, 721 (2010)

SUMMARY OF THE INVENTION

Problem to be Solved by the Invention

High $E/k_B T$ can be expected from the perpendicular MTJ element because the element employs a ferromagnetic material with high crystal magnetic anisotropy as a recording layer. Further, a demagnetizing field that acts to interfere with magnetization reversal of the recording layer in an in-plane MTJ element acts in a magnetization reversal assisting direction in a perpendicular MTJ element. Thus, it can be expected that the write current $I_{co}$ can be decreased.

However, in an actually fabricated perpendicular MTJ element, it is very difficult to satisfy a high TMR ratio, a high $E/k_B T$, and a low $I_{co}$. First, a problem in terms of TMR ratio is that the ferromagnetic material used is an ordered alloy, such as FePt, or an artificial lattice thin film such as represented by Co/Pt, and such material has poor crystal structure matching with MgO (001) that has been used in the conventional in-plane MTJ element. In order to obtain a high TMR ratio in excess of 100%, a combination of a MgO (001) tunnel barrier layer and a ferromagnetic layer of bcc (001) structure is basically essential. Because conventional perpendicular magnetization material is not a bcc structure, a high TMR ratio cannot be obtained even when the material is directly connected to the top and bottom of the MgO tunnel barrier layer. A structure in which CoFeB or CoFe is disposed between a perpendicular magnetization layer and a MgO tunnel barrier layer is effective in improving the TMR ratio. However, in this structure, the volume of the ferromagnet layer (recording layer) is increased, and it becomes difficult to realize a low $I_{co}$. Further, while the perpendicular magnetization of FePt or Co/Pt has a large crystal magnetic anisotropy compared with CoFeB of in-plane magnetization material, the damping constant α is high. While a large crystal magnetic anisotropy is advantageous in increasing $E/k_BT$, a high damping constant $\alpha$ leads to an increase in $I_{c0}$.

Meanwhile, in a perpendicular MTJ element of CoFeB/MgO/CoFeB as a basic structure in which perpendicular magnetic anisotropy is expressed by disposing an oxide layer on an interfere of CoFeB and decreasing the CoFeB film thickness, a high TMR ratio based on the MgO (001) and the bcc (001) structure of CoFeB can be obtained. Further, a high $E/k_BT$ due to perpendicular magnetization structure, and a low $I_{c0}$ due to a low damping constant $\alpha$ can be realized.

Thus, while the CoFeB perpendicular MTJ element exhibits excellent characteristics, further improvement in characteristics is desirable for application in highly integrated memories. An essential problem of an MTJ element is a decrease in thermal stability ($E/k_BT$) as a result of element miniaturization, and it is desirable to increase the perpendicular magnetic anisotropy of the CoFeB layer so as to cope with high integration and ultra-fine fabrication. In the case of the CoFeB/MgO/CoFeB basic structure, the ease of magnetization reversal of the pinned layer and the recording layer (namely, write current $I_{c0}$) is determined only by the CoFeB film thickness. In order to obtain a stable operation such that erroneous magnetization reversal of the pinned layer does not occur during magnetization reversal of the recording layer, it is desirable to further increase the perpendicular magnetic anisotropy on the pinned layer side. With regard to the above problem, the perpendicular magnetic anisotropy of the CoFeB thin film originates from the interfere with the oxide layer, so that, for an increase in perpendicular magnetic anisotropy, a structure in which an oxide layer is also disposed on the opposite side from the MgO tunnel barrier layer is promising. However, in this structure, the resistance of the element as a whole is increased by the increase in the oxide layers, resulting in the problem that a current required for magnetization reversal cannot be caused to flow by a transistor.

The present invention proposes a structure such that, in a perpendicular MTJ element, element operation stability can be increased by increasing the thermal stability factor ($E/k_BT$) of the recording layer and the pinned layer, or by increasing the perpendicular magnetic anisotropy of the pinned layer with respect to the recording layer, while an increase in the resistance of the element as a whole is suppressed and a high TMR ratio and a low write current are maintained.

Means for Solving the Problems

According to the present invention, in a perpendicular MTJ element employing CoFeB, an electrically conductive oxide layer is disposed on at least one of a recording layer and a pinned layer each comprising a ferromagnetic material CoFeB, on a side opposite from a tunnel barrier layer.

A tunnel magnetoresistive effect element according to the present invention comprises a recording layer having a perpendicular magnetic anisotropy; a pinned layer having a perpendicular magnetic anisotropy and of which a magnetization direction is fixed in one direction; and an oxide tunnel barrier layer disposed between the recording layer and the pinned layer.

According to an embodiment of the present invention, the recording layer and the pinned layer comprise a ferromagnetic material including at least one type of a 3d transition metal, with a magnetization direction oriented in a perpendicular direction with respect to a film plane by film thickness control. At least one of the recording layer and the pinned layer is provided with an electrically conductive oxide layer disposed on an interface on an opposite side from the tunnel barrier layer.

According to another embodiment of the present invention, the pinned layer has a structure stacking a first ferromagnetic layer and a second ferromagnetic layer, with the first ferromagnetic layer disposed on the tunnel barrier layer side. The recording layer and the first ferromagnetic layer comprise a ferromagnetic material including at least one type of a 3d transition metal, with a magnetization direction oriented in a perpendicular direction with respect to a film plane by film thickness control. An electrically conductive oxide layer is disposed on an interface of the recording layer on an opposite side from the tunnel barrier layer.

Preferably, the recording layer, the pinned layer, and the first ferromagnetic layer are Fe, CoFe, or CoFeB, with a film thickness in a range of from 0.5 nm to 3 nm. Preferably, the tunnel barrier layer is MgO or an oxide of MgO as a principal component to which Zn is added.

Effects of the Invention

In the CoFeB on both upper and lower sides of which an oxide layer is disposed, perpendicular magnetic anisotropy is increased. Because the electrically conductive oxide layer has a lower resistance than the tunnel barrier layer, an increase in resistance of the element as a whole can be decreased to a negligible level. As a result, according to the present invention, a perpendicular MTJ element with low resistance and high thermal stability in which erroneous writing of the pinned layer is prevented and which can operate stably can be obtained.

Other problems, configurations, and effects will become apparent from the following description of embodiments.

DETAILED DESCRIPTION OF THE PREFERRED EMBODIMENTS

An embodiment of the present invention will be described in detail with reference to the drawings.

Example 1

Figure 1:
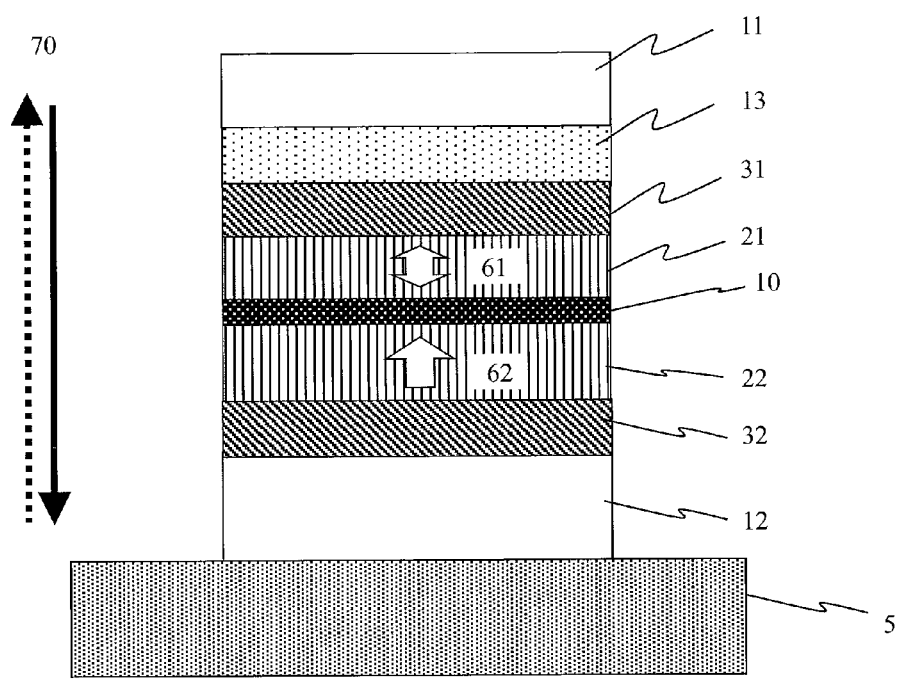
FIG. 1 is a schematic cross-sectional view of a MTJ element according to Example 1.

FIG. 1 is a schematic cross-sectional view of an MTJ element according to Example 1. On a Si substrate 5 on which a thermally oxidized film is formed, thin films of a lower electrode 12, an oxide underlayer 32, a pinned layer 22, a tunnel barrier layer 10, a recording layer 21, an oxide cap layer 31, a metal cap layer 13, and an upper electrode 11 are formed in that order. For the tunnel barrier layer 10, MgO (film thickness: 1 nm) was used. For a ferromagnetic layer comprising the recording layer 21, CoFeB (film thickness: 1.5 nm) was applied. For a ferromagnetic layer comprising the pinned layer 22, CoFeB (film thickness: 1 nm) was applied. For the oxide underlayer 32 and the oxide cap layer 31 adjoining the pinned layer 22 and the recording layer 21, respectively, $RuO_2$, which is an electrically conductive oxide, was used (film thickness: 3 nm). The lower electrode comprised stacked films of Ta (film thickness: 5 nm)/Ru (film thickness: 10 nm)/Ta (film thickness: 5 nm) stacked in that order from the substrate side. The metal cap layer 13 comprised stacked films of Ta (film thickness: 5 nm)/Ru (film thickness: 10 nm) stacked in that order. The upper electrode 11 comprised stacked films of Cr (film thickness: 5 nm)/Au (film thickness: 100 nm).

The respective layers were formed on the Si substrate 5 by RF sputtering using Ar gas. After the stacked thin films up to the metal cap layer 13 were formed successively from the bottom, the films were processed into a pillar shape with a diameter of 100 nm by electronic beam (EB) lithography and ion beam etching. Thereafter, the upper electrode 11 with a Cr (film thickness: 5 nm)/Au (film thickness: 100 nm) stacked structure was formed. While not shown in the drawings, to the upper electrode layer 11 and the lower electrode layer 12, wires for current flow through the element are connected. After the element was fabricated, annealing was performed in a perpendicular magnetic field at 300° C.

An operation of the element will be described. First, the ferromagnet comprising the recording layer 21 and the pinned layer 22 is CoFeB, and perpendicular magnetic anisotropy is expressed at the interface with the MgO of the tunnel barrier layer 10, and at the interface with the oxide cap layer 31 and the oxide underlayer 32. The film thicknesses are appropriately set such that the magnetization easy axis is oriented in the perpendicular direction. When a current 70 is caused to flow through the MTJ element, a magnetization 61 in the recording layer 21 is reversed by the current direction. On the other hand, the film thickness of the pinned layer 22 is smaller than the film thickness of the recording layer 21. The perpendicular magnetic anisotropy of CoFeB is predisposed to increase with decreasing film thickness. Thus, in the pinned layer 22, the current value at which magnetization reversal is caused (write current: $I_{c0}$) is higher than that of the recording layer 21. Accordingly, when the magnetization 61 of the recording layer 21 is reversed, a magnetization 62 of the pinned layer 22 is fixed and not reversed.

When the magnetization 61 of the recording layer 21 and the magnetization 62 of the pinned layer 22 opposite each other across the tunnel barrier layer 10 are in parallel arrangement, the element is in low resistance state. Conversely, when the magnetization 61 and the magnetization 62 are in antiparallel arrangement, the element in high resistance state. The CoFeB of the recording layer 21 and the pinned layer 22 has bcc (001) structure due to anneal process, and a high TMR ratio of 100% or more was obtained by a combination with the MgO (001) structure tunnel barrier layer 10.

In the present Example, the perpendicular magnetic anisotropy of the recording layer 21 and the pinned layer 22 is increased by the oxide cap layer 31 and the oxide underlayer 32 compared with the CoFeB/MgO/CoFeB basic structure without the oxide cap layer and the oxide underlayer. As a result, the thermal stability $E/k_BT$ of the recording layer 21 and the pinned layer 22 increased by approximately two fold, compared with the CoFeB/MgO/CoFeB basic structure. Further, the oxide cap layer 31 and the oxide underlayer 32 are the electrically conductive oxide $RuO_2$ (film thickness: 3 nm) with the resistivity of not more than $10^{-3}$ $\Omega$cm, so that an areal resistance RA is not more than 0.03 $\Omega\mu m^2$. This is smaller than the RA=approximately 10 $\Omega\mu m^2$ of the MgO tunnel barrier layer 10 (film thickness: 1 nm) by about three orders of magnitude. Namely, a dominant factor in determining the resistance of the MTJ element is the MgO tunnel barrier layer 10, and the contribution by the $RuO_2$ layer can be virtually disregarded. As a result, in the configuration of the present Example, the thermal stability $E/k_BT$ can be increased while substantially the same level of resistance as the resistance of the MTJ element with the CoFeB/MgO/CoFeB basic structure is maintained.

While in the present Example, $RuO_2$ is used in the oxide cap layer 31 and the oxide underlayer 32, other electrically conductive oxides may be used. Examples of the material that may be used in the oxide cap layer 31 or the oxide underlayer 32 include rutile-$MoO_2$ type oxides similar to $RuO_2$ used in the present Example, such as $VO_2$, $CrO_2$, $NbO_2$, $MoO_2$, $WO_2$, $ReO_2$, $RhO_2$, $OsO_2$, $IrO_2$, $PtO_2$, $V_3O_5$, and $Ti_3O_5$. Other examples that may be used include NaCl type oxides such as TiO, VO, NbO, LaO, NdO, SmO, EuO, SrO, BaO, and NiO; spinel type oxides such as represented by $LiTi_2O_4$, $LiV_2O_4$, $Fe_3O_4$; perovskite-$ReO_3$ type oxides such as $ReO_3$, $CaCrO_3$, $SrCrO_3$, $BaMoO_3$, $SrMoO_3$, $CaMoO_3$, $LaCuO_3$, $CaRuO_3$, $SrVO_3$, and $BaTiO_3$; corundum type oxides such as $Ti_2O_3$, $V_2O_3$, and $Rh_2O_3$; and oxide semiconductors such as ZnO, $TiO_2$, $SnO_2$, $Cu_2O$, $Ag_2O$, $In_2O_3$, and $WO_3$. A plurality of layers of such materials may be stacked, of which the electrically conductive oxide used for the cap layer and the underlayer of the perpendicular MTJ element may preferably have a resistivity of not more than 0.1 $\Omega$cm as a characteristic that does not influence the resistance of the element as a whole.

The film thickness of CoFeB used in the recording layer 21 and the pinned layer 22 of the perpendicular MTJ element is at least 0.5 nm or greater and at most 3 nm or less, and more preferably between 1 nm and 2 nm. This is because if the film thickness of the CoFeB is too small, the ferromagnet function is not obtained; on the other hand, if the thickness is too large, the strength of the perpendicular magnetic anisotropy is decreased. While in the present Example, CoFeB is used for the recording layer 21 and the pinned layer 22, it goes without saying that a similar effect can be obtained when other materials with bcc crystal structure, such as CoFe and Fe are used. This is because the perpendicular magnetic anisotropy expression mechanism utilized in the present invention is due to a hybridization of the 3d electron orbital of Fe or Co and the 2p electron orbital of O of an oxide.

While in the present Example, MgO was used for the tunnel barrier layer 10, MgO with a small amount of Zn added thereto, or MgZnO, may be used. In this case, the tunnel resistance of the tunnel barrier layer can be decreased while the NaCl structure required for achieving a high TMR is maintained, whereby the resistance of the element can be further suppressed.

Example 2

Figure 2:
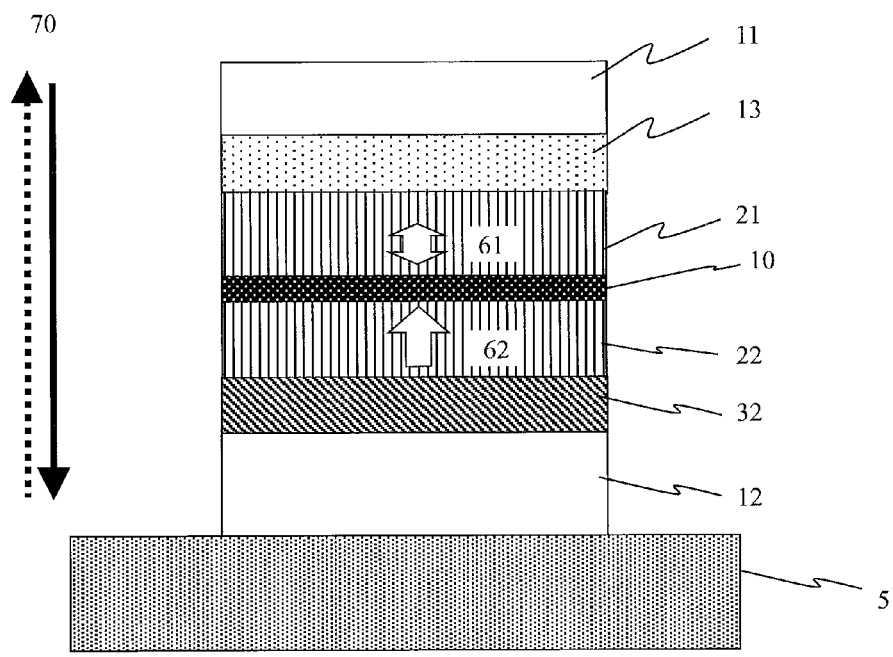
FIG. 2 is a schematic cross-sectional view of the MTJ element according to Example 2.

In Example 2, a structure in which an electrically conductive oxide is disposed on only the pinned layer side is applied. FIG. 2 is a schematic cross-sectional view of the MTJ element according to Example 2. Example 2 differs from Example 1 in that an oxide cap layer is not disposed on the recording layer 21, and that the CoFeB comprising the recording layer 21 has a film thickness of 1.2 nm. Example 2 is similar to Example 1 in other respects of the stacked structure, and the material and film thickness of each layer. The fabrication method and operation of the element are also similar to Example 1.

In the case of Example 2, too, the CoFeB film thickness of the pinned layer 22 (1 nm) is smaller than the CoFeB film thickness (1.2 nm) of the recording layer 21. Due to this film thickness difference, the perpendicular magnetic anisotropy of the pinned layer 22 is basically greater than the perpendicular magnetic anisotropy of the recording layer 21. In addition, the perpendicular magnetic anisotropy of the pinned layer 22 is further increased by the oxide underlayer 32. The current ($I_{c0}$) required for magnetization reversal of the ferromagnetic layer increases with the strength of the perpendicular magnetic anisotropy. Thus, when magnetization reversal of the recording layer 21 is caused by current, the erroneous operation involving magnetization reversal of the pinned layer 22 can be suppressed.

In the conventional CoFeB/MgO/CoFeB basic structure, the strength of perpendicular magnetic anisotropy is controlled solely by the film thickness of the recording layer 21 and the pinned layer 22. In contrast, in the structure according to Example 2, the difference in strength (magnetization reversal current) of the perpendicular magnetic anisotropy between the pinned layer 22 and the recording layer 21 can be increased by using an oxide layer under the pinned layer. In this way, even when the film thickness of the recording layer 21 is adjusted to be closer to the film thickness of the pinned layer 22 (i.e., even when formed into a thin layer), operational stability is not adversely affected. Namely, compared with the CoFeB/MgO/CoFeB basic structure, the film thickness of the recording layer 21 can be decreased. As a result, the thermal stability $E/k_B T$ of the recording layer 21 can be increased while erroneous writing of the pinned layer 22 is suppressed. Because the oxide underlayer 32 is an electrically conductive oxide, an increase in resistance of the element can be prevented. Further, it goes without saying that by using CoFeB, a high TMR ratio in excess of 100% can be achieved.

While in the present Example $RuO_2$ is used for the oxide underlayer 32, other electrically conductive oxides may be used. Examples of the materials that may be used for the oxide underlayer 32 include rutile-$MoO_2$ type oxides similar to $RuO_2$ used in the present Example, such as $VO_2$, $CrO_2$, $NbO_2$, $MoO_2$, $WO_2$, $ReO_2$, $RhO_2$, $OsO_2$, $IrO_2$, $PtO_2$, $V_3O_5$, and $Ti_3O_5$. Other examples include NaCl type oxides such as TiO, VO, NbO, LaO, NdO, SmO, EuO, SrO, BaO, and NiO; spinel type oxides such as represented by $LiTi_2O_4$, $LiV_2O_4$, and $Fe_3O_4$; perovskite-$ReO_3$ type oxides such as $ReO_3$, $CaCrO_3$, $SrCrO_3$, $BaMoO_3$, $SrMoO_3$, $CaMoO_3$, $LaCuO_3$, $CaRuO_3$, $SrVO_3$, and $BaTiO_3$; corundum type oxides such as $Ti_2O_3$, $V_2O_3$, and $Rh_2O_3$; and oxide semiconductors such as ZnO, $TiO_2$, $SnO_2$, $Cu_2O$, $Ag_2O$, $In_2O_3$, and $WO_3$. A plurality of layers of such materials may be stacked, of which the electrically conductive oxide used in the underlayer of the pinned layer of the perpendicular MTJ element may preferably have a resistivity of not more than 0.1 Ωcm as a characteristic that does not influence the resistance of the element as a whole.

The film thickness of the CoFeB used for the recording layer 21 and the pinned layer 22 of the perpendicular MTJ element may be at least 0.5 nm or more and at most 3 nm or less, and more preferably between 1 nm and 2 nm. This is because if the film thickness of CoFeB is too small, the ferromagnet function cannot be obtained; if the film thickness is too large, the strength of the perpendicular magnetic anisotropy is decreased. While in the present Example, CoFeB is used for the recording layer 21 and the pinned layer 22, it goes without saying that a similar effect can be obtained when other materials with the bcc crystal structure, such as CoFe and Fe, are used. This is because the perpendicular magnetic anisotropy expression mechanism utilized by the present invention is due to a hybridization of the 3d electron orbital of Fe or Co and the 2p electron orbital of O of an oxide.

While in the present Example, MgO is used for the tunnel barrier layer 10, MgO with a small amount of Zn added thereto, or MgZnO, may be used. In this case, the tunnel resistance of the tunnel barrier layer can be decreased while the NaCl structure required for achieving a high TMR is maintained, whereby the element resistance can be further suppressed.

Example 3

Figure 3:
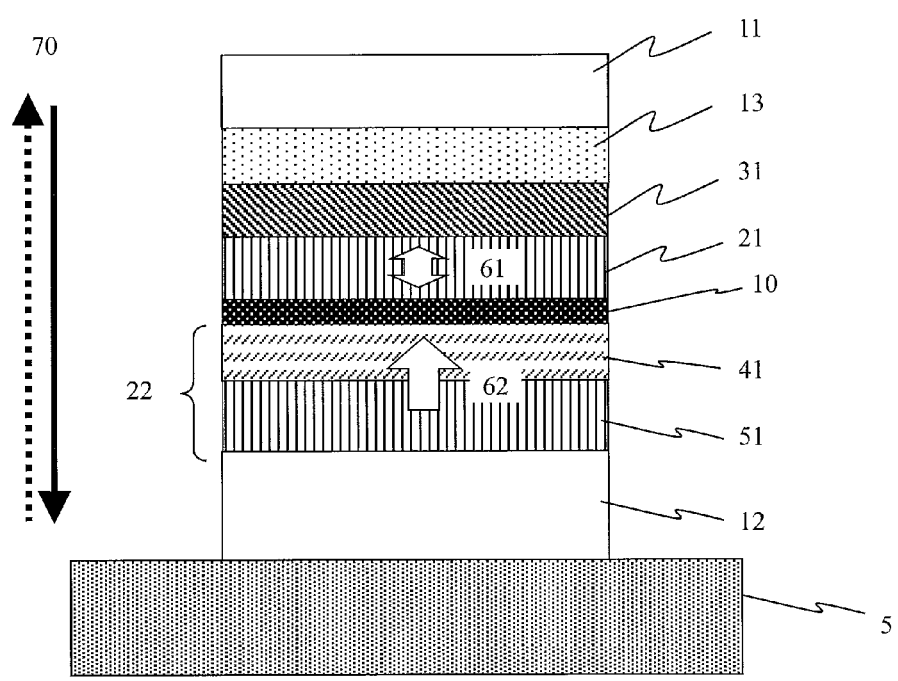
FIG. 3 is a schematic cross-sectional view of the MTJ element according to Example 3.

Example 3 proposes a perpendicular MTJ element combining a CoFeB recording layer and a pinned layer of a material other than CoFeB. FIG. 3 is a schematic cross-sectional view of the MTJ element according to Example 3. Example 3 differs from Example 1 in that an electrically conductive oxide layer is not disposed under the pinned layer 22 and is disposed only on the recording layer 21. Further, in Example 3, the pinned layer 22 is fabricated from a stacked structure of a first ferromagnetic layer 41 and a second ferromagnetic layer 51. For the first ferromagnetic layer 41, CoFeB (film thickness: 2 nm) is used, and for the second ferromagnetic layer 51, an $L1_0$ type ordered alloy of $Co_{50}Pt_{50}$ (film thickness: 3 nm) was applied. Example 3 is similar to Example 1 in other materials and film thicknesses, and element fabrication method. The first ferromagnetic layer 41 and the second ferromagnetic layer 51 comprising the pinned layer 22 are ferromagnetically coupled, with their magnetization directions linked to each other. Thus, the magnetization of the pinned layer 22 can be considered a single magnetization, so that the element operation is also similar to Example 1.

The perpendicular magnetic anisotropy of the recording layer is increased by the oxide cap layer 31 disposed on top of the recording layer 21, whereby the thermal stability $E/k_B T$ of the recording layer is increased. Further, in the case of Example 3, the CoPt ordered alloy used for the second ferromagnetic layer 51 has greater perpendicular magnetic anisotropy than the CoFeB thin film of the recording layer 21, whereby the pinned layer 22 is magnetically stabilized. Further, because the first ferromagnetic layer 41 adjoining the tunnel barrier layer 10 of MgO is CoFeB, a high TMR ratio can be obtained. Thus, when the structure according to the present Example is used, the thermal stability $E/k_B T$ of the recording layer 21 can be increased compared with a configuration without the oxide cap layer 31 while erroneous writing of the pinned layer 22 is suppressed, as in Examples 1 and 2. Because the oxide cap layer 31 is an electrically conductive oxide, an increase in element resistance can be prevented. Further, it goes without saying that because CoFeB is disposed on both sides of the tunnel barrier layer 10, a high TMR ratio in excess of 100% can be achieved.

While in the present Example, $RuO_2$ is used for the oxide cap layer 31, other electrically conductive oxides may be used. Examples of the material that may be used for the oxide cap layer 31 include rutile-$MoO_2$ type oxides similar to $RuO_2$ used in the present Example, such as $VO_2$, $CrO_2$, $NbO_2$, $MoO_2$, $WO_2$, $ReO_2$, $RhO_2$, $OsO_2$, $IrO_2$, $PtO_2$, $V_3O_5$, and $Ti_3O_5$. Other examples that may be used include NaCl type oxides such as TiO, VO, NbO, LaO, NdO, SmO, EuO, SrO, BaO, and NiO; spinel type oxides such as represented by $LiTi_2O_4$, $LiV_2O_4$, and $Fe_3O_4$; perovskite-$ReO_3$ type oxides such as $ReO_3$, $CaCrO_3$, $SrCrO_3$, $BaMoO_3$, $SrMoO_3$, $CaMoO_3$, $LaCuO_3$, $CaRuO_3$, $SrVO_3$, and $BaTiO_3$; corundum type oxides such as $Ti_2O_3$, $V_2O_3$, and $Rh_2O_3$; and oxide semiconductors such as ZnO, $TiO_2$, $SnO_2$, $Cu_2O$, $Ag_2O$, $In_2O_3$, and $WO_3$. A plurality of layers of such material may be stacked, of which the electrically conductive oxide used for the cap layer of the perpendicular MTJ element may preferably have a resistivity of not more than 0.1 Ωcm as a characteristic that does not influence the resistance of the element as a whole.

The film thickness of the CoFeB used for the first ferromagnetic layer 41 comprising the recording layer 21 and the pinned layer 22 of the perpendicular MTJ element may be at least 0.5 nm or greater and at most 3 nm or less, and more preferably between 1 nm and 2 nm. This is because if the film thickness of CoFeB is too small, the ferromagnet function cannot be obtained; if the film thickness is too large, the strength of the perpendicular magnetic anisotropy is decreased. Further, while in the present Example, CoFeB is used for the first ferromagnetic layer 41 comprising the recording layer 21 and the pinned layer 22, it goes without saying that a similar effect can be obtained when other materials with the bcc crystal structure, such as CoFe or Fe, is used.

In the Example 3, the $L1_0$ type ordered alloy of $Co_{50}Pt_{50}$ is applied as the perpendicular magnetization material of the second ferromagnetic layer 51 comprising the pinned layer 22. However, a similar effect can be obtained when other perpendicular magnetization materials are applied. Concrete examples of the material include $L1_0$ type ordered alloys containing Co—Pt, Co—Pd, Fe—Pt, or Fe—Pd as a principal component, such as $Fe_{50}Pt_{50}$; an $L1_1$ type ordered alloy of $Co_{50}Pt_{50}$; a $Co_{75}Pt_{25}$ ordered alloy of m-$D0_{19}$ type; granular structure materials in which a granular magnetic material is dispersed in a non-magnetic parent phase, such as CoCrPt—$SiO_2$ or FePt—$SiO_2$; a stacked film including an alternate stack of an alloy containing at least one or a plurality of Fe, Co, and Ni and a non-magnetic metal such as Ru, Pt, Rh, Pd, or Cr; amorphous alloys of a rare-earth metal, such as Gd, Dy, or Tb, containing a transition metal, such as TbFeCo and GdFeCo; and a Co-based alloy, such as CoCr and CoPtCr.

While in the present Example MgO is used for the tunnel barrier layer 10, MgO with a small amount of Zn added thereto, or MgZnO, may be used. In this case, the tunnel resistance of the tunnel barrier layer can be decreased while the NaCl structure required for achieving a high TMR is maintained, whereby the element resistance can be further suppressed.

Example 4

Figure 4:
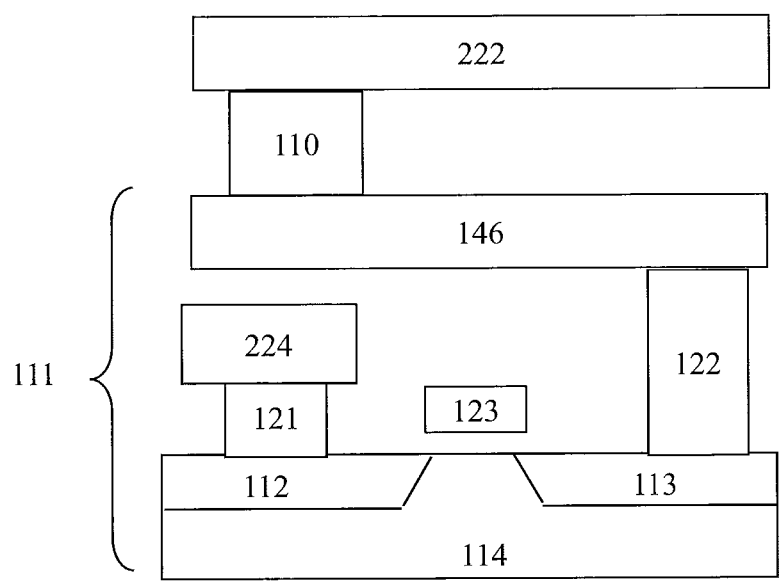
FIG. 4 is a schematic cross-sectional view illustrating a configuration of a magnetic memory cell according to Example 4.

Example 4 proposes a random access memory to which the MTJ element according to the present invention is applied. FIG. 4 is a schematic cross-sectional view of a configuration example of a magnetic memory cell according to the present invention. The magnetic memory cell includes a MTJ element 110 according to any of Examples 1 to 3.

A transistor 111 includes two n-type semiconductors 112 and 113, and a single p-type semiconductor 114. To the n-type semiconductor 112, a source line 224 is connected via an electrode 121. To the n-type semiconductor 113, the MTJ element 110 is connected via an electrode 122 and an electrode 146. Further, to the gate electrode 123, a word line 223 is connected, which is not shown. The ON/OFF of the gate electrode 123 is controlled by a signal from the word line, and the ON/OFF of current flow between the electrode 122 and the electrode 121 is controlled. A bit line 222 is connected to the upper electrode 11 of the MTJ element 110. In the magnetic memory cell according to the present Example, current is caused to flow between the bit line 222 and the electrode 146 by controlling the transistor 111. A spin transfer torque produced by the current acts on the magnetization of the recording layer in the MTJ element 110 so as to reverse the direction of magnetization. Thus, magnetic information of the MTJ element 110 is recorded.

Figure 5:
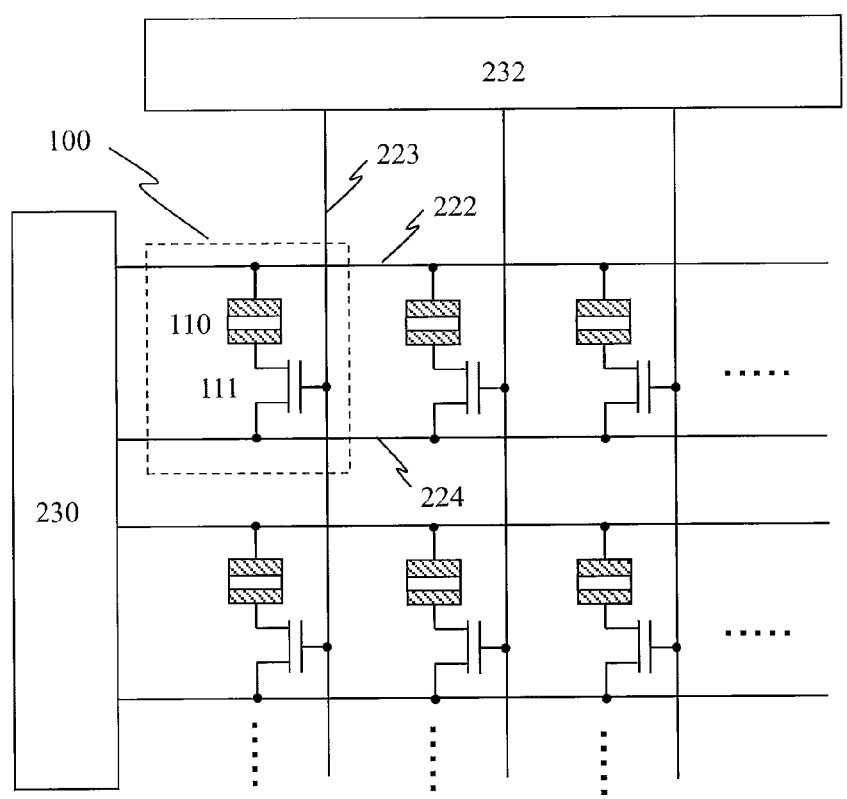
FIG. 5 is a schematic view illustrating a configuration of a random access memory according to Example 4.

FIG. 5 shows a configuration example of a magnetic random access memory in which the magnetic memory cells are disposed. To the gate electrode 123 of the transistor 111, the word line 223 is connected. To another electrode 121 of the transistor, the source line 224 is connected. To the MTJ element 110, the bit line 222 is connected.

When writing in the present configuration, first, a write enable signal is sent to a write driver 230 connected to the bit line 222 in which current is desired to flow, so as to boost the write driver 230. Then, a write enable signal is sent to a write driver 232 connected to the word line 223 so as to boost the write driver 232 to turn on the transistor 111 connected to the MTJ element to be written. Thus, a current flows in the direction from the MTJ element 110 to the transistor 111, whereby spin torque magnetization reversal occurs. After the transistor is on for a predetermined time, the signal to the write driver 232 is cut off so as to turn off the transistor. When the magnetization direction of the recording layer of the MTJ element 110 is reversed (to rewrite "0" and "1" information), a current in the opposite direction from the above write operation may be caused to flow. Namely, the voltage of the source line 224 is made higher than the voltage of the bit line 222, and then the write driver 232 is boosted to turn on the transistor 111. In this way, a current flows in the direction from the transistor 111 to the MTJ element 110, whereby the magnetization direction of the recording layer is reversed and the information is rewritten. When reading, only the bit line 222 connected to the MTJ element to be read is boosted to a read voltage V, whereby only a selected transistor is turned on to cause current flow for reading. This structure is based on the simplest one-transistor+one-memory cell configuration in which the area occupied by the unit cell is $2F \times 4F = 8F^2$, whereby high integration can be achieved.

The present invention is not limited to the above Examples and may include various modifications. The above Examples have been described for facilitating understanding of the present invention, and the invention is not limited to a configuration including all of the elements described. A part of the configuration of one example may be substituted by an element of the configuration of another example, or an element of the configuration of the other example may be added to the configuration of the one example. With respect to a part of the configuration of each example, addition, deletion, or substitution of another configuration may be possible.

REFERENCE SIGNS LIST 5 substrate
10 tunnel barrier layer
11 upper electrode
12 lower electrode
21 recording layer
22 pinned layer
31 oxide cap layer
32 oxide pinned layer
41 first ferromagnetic layer
51 second ferromagnetic layer
61, 62 magnetization
70 current
100 memory cell
110 MTJ element
111 transistor
112, 113 n-type semiconductor
114 p-type semiconductor
121 electrode
122 electrode
123 gate electrode 146 electrode
222 bit line
223 word line
224 source line
230, 232 write driver

The invention claimed is:

1. A tunnel magnetoresistive effect element comprising:
a recording layer with a perpendicular magnetic anisotropy;
a pinned layer with a perpendicular magnetic anisotropy and with a magnetization direction fixed in one direction; and
an oxide tunnel barrier layer disposed between the recording layer and the pinned layer,
the tunnel magnetoresistive effect element characterized in that:
one of the recording layer and the pinned layer comprises a ferromagnetic material including at least one type of a 3d transition metal, with a magnetization direction oriented in a perpendicular direction with respect to a film plane by anisotropy at an interface with the tunnel barrier layer; and
at least one of the recording layer and the pinned layer is provided with an electrically conductive oxide layer disposed on an interface on a side opposite to the tunnel barrier layer, the electrically conductive oxide layer being adapted to increase the perpendicular magnetic anisotropy.

2. The tunnel magnetoresistive effect element according to claim 1, characterized in that the 3d transition metal is at least one of Co and Fe.

3. The tunnel magnetoresistive effect element according to claim 1, characterized in that the ferromagnetic material comprising the recording layer and the pinned layer is Fe, CoFe, or CoFeB.

4. The tunnel magnetoresistive effect element according to claim 1, characterized in that the recording layer and the pinned layer has a film thickness in a range of from 0.5 nm to 3 nm.

5. The tunnel magnetoresistive effect element according to claim 1, characterized in that the electrically conductive oxide layer is:
$RuO_2$, $VO_2$, $CrO_2$, $NbO_2$, $MoO_2$, $WO_2$, $ReO_2$, $RhO_2$, $OsO_2$, $IrO_2$, $PtO_2$, $V_3O_5$, or $Ti_3O_5$, which are rutile-$MoO_2$ type oxides;
TiO, VO, NbO, LaO, NdO, SmO, EuO, SrO, BaO, or NiO, which are NaCl type oxides;
$LiTi_2O_4$, $LiV_2O_4$, or $Fe_3O_4$, which are spinel type oxides;
$ReO_3$, $CaCrO_3$, $SrCrO_3$, $BaMoO_3$, $SrMoO_3$, $CaMoO_3$, $LaCuO_3$, $CaRuO_3$, $SrVO_3$, or $BaTiO_3$, which are perovskite-$ReO_3$ type oxides;
$Ti_2O_3$, $V_2O_3$, or $Rh_2O_3$, which are corundum type oxides; or
ZnO, $TiO_2$, $SnO_2$, $Cu_2O$, $Ag_2O$, $In_2O_3$, or $WO_3$, which are oxide semiconductors.

6. The tunnel magnetoresistive effect element according to claim 1, characterized in that the tunnel barrier layer is MgO, or an oxide of MgO as a principal component to which Zn is added.

7. A tunnel magnetoresistive effect element comprising:
a recording layer with a perpendicular magnetic anisotropy;
a pinned layer with a perpendicular magnetic anisotropy and with a magnetization direction fixed in one direction; and
an oxide tunnel barrier layer disposed between the recording layer and the pinned layer,
characterized in that:
the pinned layer has a structure in which a first ferromagnetic layer and a second ferromagnetic layer are stacked, with the first ferromagnetic layer disposed on the tunnel barrier layer side;
one of the recording layer and the first ferromagnetic layer comprises a ferromagnetic material including at least one type of a 3d transition metal, with a magnetization direction oriented in a perpendicular direction with respect to a film plane by anisotropy at an interface with the tunnel barrier layer; and
an electrically conductive oxide layer is disposed on an interface of the recording layer on a side opposite to the tunnel barrier layer, the electrically conductive oxide layer being adapted to increase the perpendicular magnetic anisotropy.

8. The tunnel magnetoresistive effect element according to claim 7, characterized in that the 3d transition metal is at least one of Co and Fe.

9. The tunnel magnetoresistive effect element according to claim 7, characterized in that the recording layer and the first ferromagnetic layer are Fe, CoFe, or CoFeB.

10. The tunnel magnetoresistive effect element according to claim 7, characterized in that the recording layer and the first ferromagnetic layer have a film thickness in a range of from 0.5 nm to 3 nm.

11. The tunnel magnetoresistive effect element according to claim 7, characterized in that the second ferromagnetic layer is:
an alloy layer including Co and one or more element selected from Cr, Ta, Nb, V, W, Hf, Ti, Zr, Pt, Pd, Fe, and Ni;
a stacked film comprising an alternate stack of an alloy including one or a plurality of Fe, Co, and Ni, and a non-magnetic metal selected from Ru, Pt, Rh, Pd, and Cr;
a layer having a granular structure of a granular magnetic phase surrounded by a non-magnetic phase;
an amorphous alloy layer including a rare-earth metal and a transition metal; or
a layer of a CoPt ordered alloy of an m-$D0_{19}$ type, a CoPt ordered alloy of an $L1_1$ type, or an ordered alloy of an $L1_0$ type having Co—Pt, Co—Pd, Fe—Pt, or Fe—Pd as a principal component.

12. The tunnel magnetoresistive effect element according to claim 7, characterized in that the electrically conductive oxide layer is:
$RUO_2$, $VO_2$, $CrO_2$, $NbO_2$, $MoO_2$, $WO_2$, $ReO_2$, $RhO_2$, $OsO_2$, $IrO_2$, $PtO_2$, $V_3O_5$, or $Ti_3O_5$, which are rutile-$MoO_2$ type oxides;
TiO, VO, NbO, LaO, NdO, SmO, EuO, SrO, BaO, or NiO, which are NaCl type oxides;
$LiTi_2O_4$, $LiV_2O_4$, or $Fe_3O_4$, which are spinel type oxides;
$ReO_3$, $CaCrO_3$, $SrCrO_3$, $BaMoO_3$, $SrMoO_3$, $CaMoO_3$, $LaCuO_3$, $CaRuO_3$, $SrVO_3$, or $BaTiO_3$, which are perovskite-$ReO_3$ type oxides;
$Ti_2O_3$, $V_2O_3$, or $Rh_2O_3$, which are corundum type oxides; or
ZnO, $TiO_2$, $SnO_2$, $Cu_2O$, $Ag_2O$, $In_2O_3$, or $WO_3$, which are oxide semiconductors.

13. The tunnel magnetoresistive effect element according to claim 7, characterized in that the tunnel barrier layer is MgO, or an oxide of MgO as a principal component to which Zn is added.

14. A random access memory comprising:
a plurality of magnetic memory cells;
a means for selecting a desired magnetic memory cell from the plurality of magnetic memory cells; and
a means for causing a current to flow through the selected magnetic memory cell in a selected direction,
characterized in that:
the magnetic memory cells include the tunnel magnetoresistive effect element according to claim 1, and a transistor for energizing the tunnel magnetoresistive effect element; and
the recording layer of the memory cell is magnetization-reversed by a spin transfer torque.

15. A random access memory comprising:
a plurality of magnetic memory cells;
a means for selecting a desired magnetic memory cell from the plurality of magnetic memory cells; and
a means for causing a current to flow through the selected magnetic memory cell in a selected direction,
characterized in that:
the magnetic memory cells include the tunnel magnetoresistive effect element according to claim 7, and a transistor for energizing the tunnel magnetoresistive effect element; and
the recording layer of the memory cell is magnetization-reversed by a spin transfer torque.

* * * * *